US012660081B2

(12) United States Patent
Cheng et al.

(10) Patent No.: US 12,660,081 B2
(45) Date of Patent: Jun. 16, 2026

(54) INTERMEDIATE CIRCUIT BOARD AND INTERMEDIATE ELECTRICAL CONNECTOR

(71) Applicant: Hirose Electric Co., Ltd., Yokohama (JP)

(72) Inventors: Xingyu Cheng, Yokohama (JP); Shota Yamada, Yokohama (JP); Takafumi Sugawara, Yokohama (JP); Nobuhiro Tamai, Yokohama (JP)

(73) Assignee: HIROSE ELECTRIC CO., LTD., Yokohama (JP)

( * ) Notice: Subject to any disclaimer, the term of this patent is extended or adjusted under 35 U.S.C. 154(b) by 174 days.

(21) Appl. No.: 18/499,044

(22) Filed: Oct. 31, 2023

(65) Prior Publication Data

US 2024/0147605 A1 May 2, 2024

(30) Foreign Application Priority Data

Nov. 1, 2022 (JP) ................................. 2022-175317

(51) Int. Cl.
*H05K 1/02* (2006.01)
*H01R 13/6469* (2011.01)
*H05K 1/03* (2006.01)

(52) U.S. Cl.
CPC ....... *H05K 1/0245* (2013.01); *H01R 13/6469* (2013.01); *H05K 1/0366* (2013.01); *H05K 2201/09245* (2013.01)

(58) Field of Classification Search
CPC ............... H05K 1/0245; H05K 1/0366; H05K 2201/09245; H01R 13/6469
See application file for complete search history.

(56) References Cited

U.S. PATENT DOCUMENTS

2012/0275122 A1* 11/2012 Howard ............... H05K 1/0245
327/564
2019/0041458 A1* 2/2019 Koki .................. G01R 31/3171

FOREIGN PATENT DOCUMENTS

| JP | 2011-077237 A | 4/2011 |
| JP | 2015-32548 A | 2/2015 |
| JP | 2015-032548 A | 2/2015 |
| JP | 2016-207776 A | 12/2016 |

OTHER PUBLICATIONS

Japanese Office Action for JP2022-175317 issued on Mar. 13, 2026.

* cited by examiner

*Primary Examiner* — Jeremy C Norris
(74) *Attorney, Agent, or Firm* — Procopio, Cory, Hargreaves & Savitch LLP

(57) ABSTRACT

The intermediate circuit board has a plate-shaped substrate and a plurality of signal transmission line pairs for differential signal transmission extending on a major face of the substrate from one end to the other end of the substrate in the direction of connection to the counterpart connect bodies; the substrate has a fiber cloth formed by braiding a plurality of fibers used to reinforce the substrate in a mesh pattern and a plate-like member made of plastic having the fiber cloth embedded therein; the plurality of signal transmission line pairs have straight pairs and cross pairs disposed in an alternating manner in the width direction of the substrate; and the straight pairs and cross pairs, when viewed in the through-thickness direction of the substrate, are formed extending inclined at an angle relative to the fibers of the fiber cloth.

9 Claims, 11 Drawing Sheets

INTERMEDIATE CIRCUIT BOARD AND INTERMEDIATE ELECTRICAL CONNECTOR

CROSS-REFERENCE TO RELATED APPLICATIONS

This application claims priority to Japanese Patent Application No. 2022-0175317, filed Nov. 1, 2022, the contents of which are incorporated herein by reference in its entirety for all purposes.

BACKGROUND

Technical Field

The present invention relates to an intermediate circuit board provided in an intermediate electrical connector establishing intermediate connections between two counterpart connect bodies, as well as to an intermediate electrical connector having said intermediate circuit boards.

Related Art

Such an intermediate electrical connector has been disclosed, for example, in Patent Document 1. In the intermediate electrical connector of Patent Document 1, a plurality of circuit boards (intermediate circuit boards), to which counterpart connectors serving as counterpart connect bodies are connected respectively from above and from below, are accommodated and retained within a square cylinder case-shaped housing while being arranged side by side in the through-thickness direction thereof. The circuit boards have a plate-shaped substrate made of an electrically insulating material, and five transmission path pairs formed as patterns extending along a major face of said substrate in the vertical direction.

The transmission path pairs, which are signal transmission line pairs for differential signal transmission having two signal transmission lines in the form of a pair (differential pair lines), form either straight pairs which, when viewed in the through-thickness direction of the substrate, extend in parallel throughout the entire extent in the vertical direction, or cross pairs, which intersect in a portion thereof in the vertical direction. In order to reduce cross-talk between adjacent differential pair lines, in the above-mentioned circuit boards, two straight pairs and three cross pairs are formed disposed in an alternating manner. In addition, in the cross pairs, the two signal transmission lines intersect in a portion thereof, thereby achieving a reduction in terms of deviation in the duration of differential signal transmission over these signal transmission lines, i.e., the so-called skew (electrical length difference).

PATENT DOCUMENTS

[Patent Document 1]
Japanese Published Patent Application No. 2015-032548.

SUMMARY

Problems to be Solved

Generally speaking, in order to ensure their strength, circuit boards are often made by embedding fiber cloth formed by braiding a plurality of fibers (for example, glass fibers) in a mesh pattern within a substrate made of plastic.

Sections of locally high and low dielectric permittivity are formed at this time within the circuit boards because of the different dielectric permittivity of the fiber cloth and plastics.

If a straight pair is formed on a major face of such a circuit board, then the patterns of dielectric permittivity distribution in the section corresponding to the entire longitudinal extent of said straight pair within the substrate of the circuit board will differ between one signal transmission line and the other signal transmission line of the straight pair. By way of example, the description herein will be directed to a case in which a straight pair is formed on a substrate having embedded therein a fiber cloth in which a plurality of fibers extending in a lengthwise direction (referred to here as "warp fibers") are braided with a plurality of fibers extending in a widthwise direction (referred to here as "weft fibers") in a grid mesh pattern. If, when viewed in the through-thickness direction of the substrate, one signal transmission line extends in a lengthwise direction at the same location as a warp fiber and the other signal transmission line extends in a lengthwise direction at a location between two adjacent warp fibers, then, in the case of said one signal transmission line, the warp fiber will be present along its entire longitudinal extent, and, in the case of the other signal transmission line, the plastics of the substrate and weft fibers will be present in an alternating manner along its entire longitudinal extent. Therefore, the patterns of dielectric permittivity distribution in the sections corresponding to the two signal transmission lines will then be quite different. Such differences in the patterns of dielectric permittivity distribution lead to an increase in the skew occurring between the two paired signal transmission lines of the straight pair.

On the other hand, if a cross pair is formed, then, due to the mid-way swapping of relative positions as a result of intersection at an intermediate location in the longitudinal direction, the patterns of dielectric permittivity distribution of the two signal transmission lines of said cross pair in the section corresponding to their entire longitudinal extent within the substrate will become substantially identical in said one signal transmission line and said other signal transmission line when the entire longitudinal extent is viewed as a whole. Therefore, in a cross pair, differences in the patterns of dielectric permittivity distribution have no appreciable effect in terms of increasing the skew occurring between the two paired signal transmission lines.

However, even though the skew is unlikely to increase in the cross pairs, a major difference (deviation) in skew between the straight pairs and cross pairs is created if the skew is prone to increase in the straight pairs. Such a difference in skew will then lead to degradation in signal transmission quality of the circuit board as a whole.

With such considerations in mind, it is an object of the present invention to provide an intermediate circuit board and an intermediate electrical connector capable of adequately reducing differences in skew between the straight pairs and cross pairs.

Technical Solution

It is an object of the present disclosure to provide an intermediate circuit board and an intermediate electrical connector capable of adequately reducing differences in skew between the straight pairs and cross pairs.

(1) The inventive intermediate circuit boards are provided in an intermediate electrical connector establishing intermediate connections between two counterpart connect bodies.

In the present invention, such an intermediate circuit board, which has a plate-shaped substrate and, on a major face of the substrate, a plurality of signal transmission line pairs for differential signal transmission extending from one end of the substrate to which one counterpart connect body is connected all the way to the other end of the substrate to which the other counterpart connect body is connected, is characterized by the fact that the substrate has a fiber cloth formed by braiding a plurality of fibers used to reinforce the substrate in a mesh pattern and a plate-like member made of plastic having the fiber cloth embedded therein; the plurality of signal transmission line pairs have straight pairs and cross pairs disposed in an alternating manner; the straight pairs are formed of two signal transmission lines extending in parallel to each other, or two signal transmission lines having intersection portions in which intersection takes place without contact at an even number of locations in the longitudinal direction of the straight pairs; the cross pairs are formed of two signal transmission lines having intersection portions in which intersection takes place without contact at an odd number of locations in the longitudinal direction of the cross pairs; and the straight pairs and cross pairs, when viewed in the through-thickness direction of the substrate, have at least one longitudinal portion of said straight pairs and cross pairs formed extending inclined at an angle relative to the fibers of the fiber cloth.

In the present invention, the straight pairs, when viewed in the through-thickness direction of the substrate, have at least one longitudinal portion of said straight pairs formed extending inclined at an angle relative to the fibers of the fiber cloth. Therefore, throughout the range of incline relative to the above-mentioned fibers, each signal transmission line of the straight pairs extends within a range in which sections of the fiber in the substrate and sections of the plastics of the plate-like member are distributed in a regular manner. As a result, the patterns of dielectric permittivity distribution in the section corresponding to the above-mentioned range of the straight pairs in the substrate become substantially identical in one signal transmission line and the other signal transmission line, and a major skew becomes less likely to occur between the two paired signal transmission lines.

On the other hand, as far as the cross pairs are concerned, a major skew between the two signal transmission lines is unlikely to occur in the first place, due to the mid-way swapping of relative positions at an odd number of locations in the longitudinal direction of the cross pairs. Furthermore, in the present invention, at least one longitudinal portion of the cross pairs is formed extending inclined at an angle relative to the fibers of the fiber cloth. Therefore, similar to what was stated above for the straight pairs, throughout the range of incline relative to the above-mentioned fibers, each signal transmission path of the cross pairs extends over a range in which sections of the fiber in the substrate and sections of the plastics of the plate-like member are distributed in a regular manner. As a result, the above-described patterns of dielectric permittivity distribution in one signal transmission line and the other signal transmission line become even closer, and a major skew becomes less likely to occur.

Thus, in the present invention, differences in skew between the straight pairs and cross pairs are adequately reduced because a major skew is unlikely to occur both in the straight pairs and in the cross pairs.

(2) In the invention of (1), the straight pairs and cross pairs, when viewed in the through-thickness direction of the substrate, may have at least one longitudinal portion of said straight pairs and cross pairs inclined at an angle of 2 to 20 degrees relative to the fibers of the fiber cloth.

(3) The inventive intermediate electrical connector is characterized by having the intermediate circuit boards of the inventions of (1) or (2).

Technical Effects

The present invention can provide an intermediate circuit board and an intermediate electrical connector capable of adequately reducing differences in skew between the straight pairs and cross pairs.

DETAILED DESCRIPTION

Embodiments of the present invention will be described below with reference to the accompanying drawings.

Figure 1:
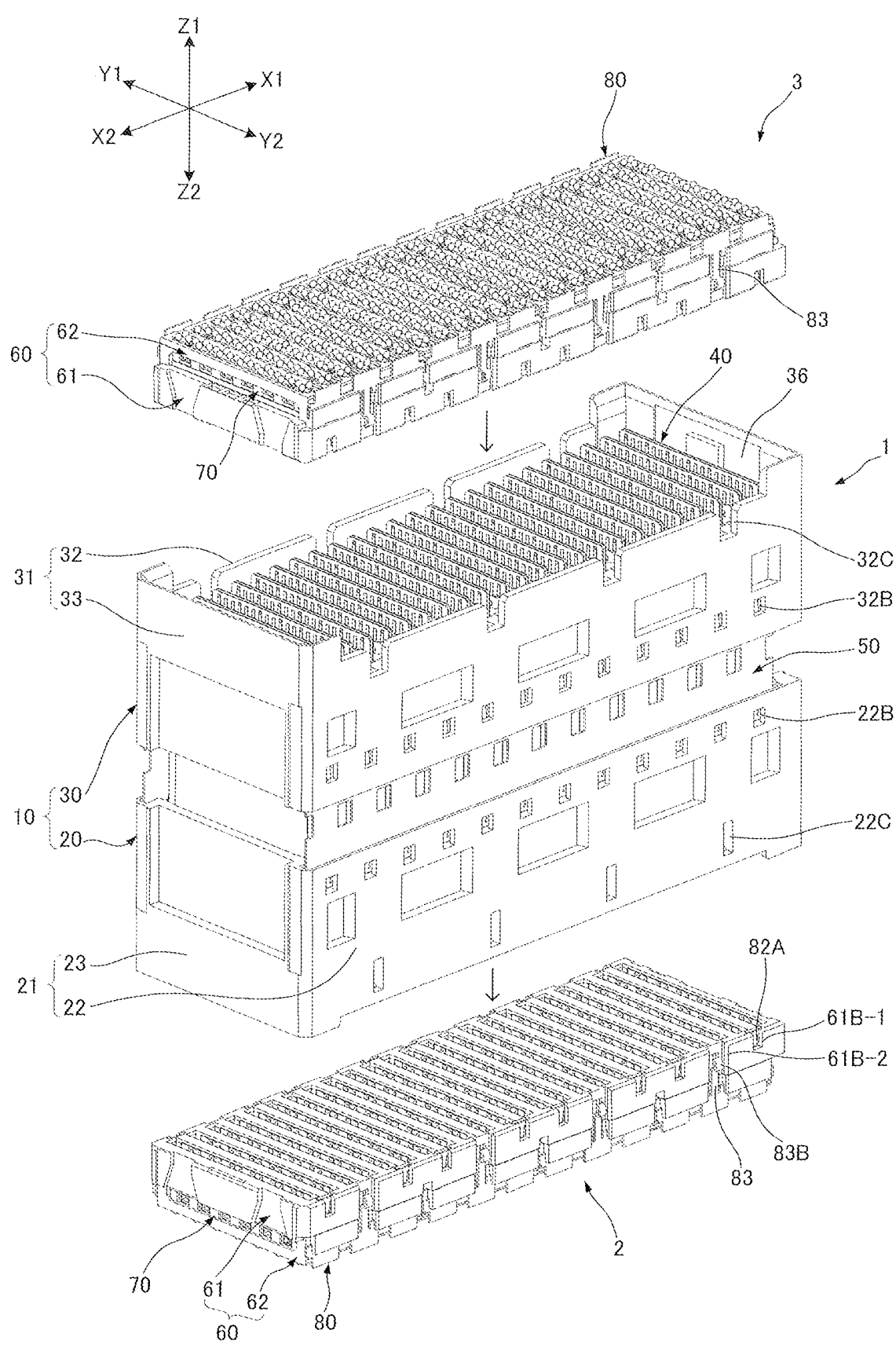
FIG. 1 illustrates a perspective view illustrating an intermediate connector according to an embodiment of the present invention along with board connectors, shown in a state before mating.
Figure 2:
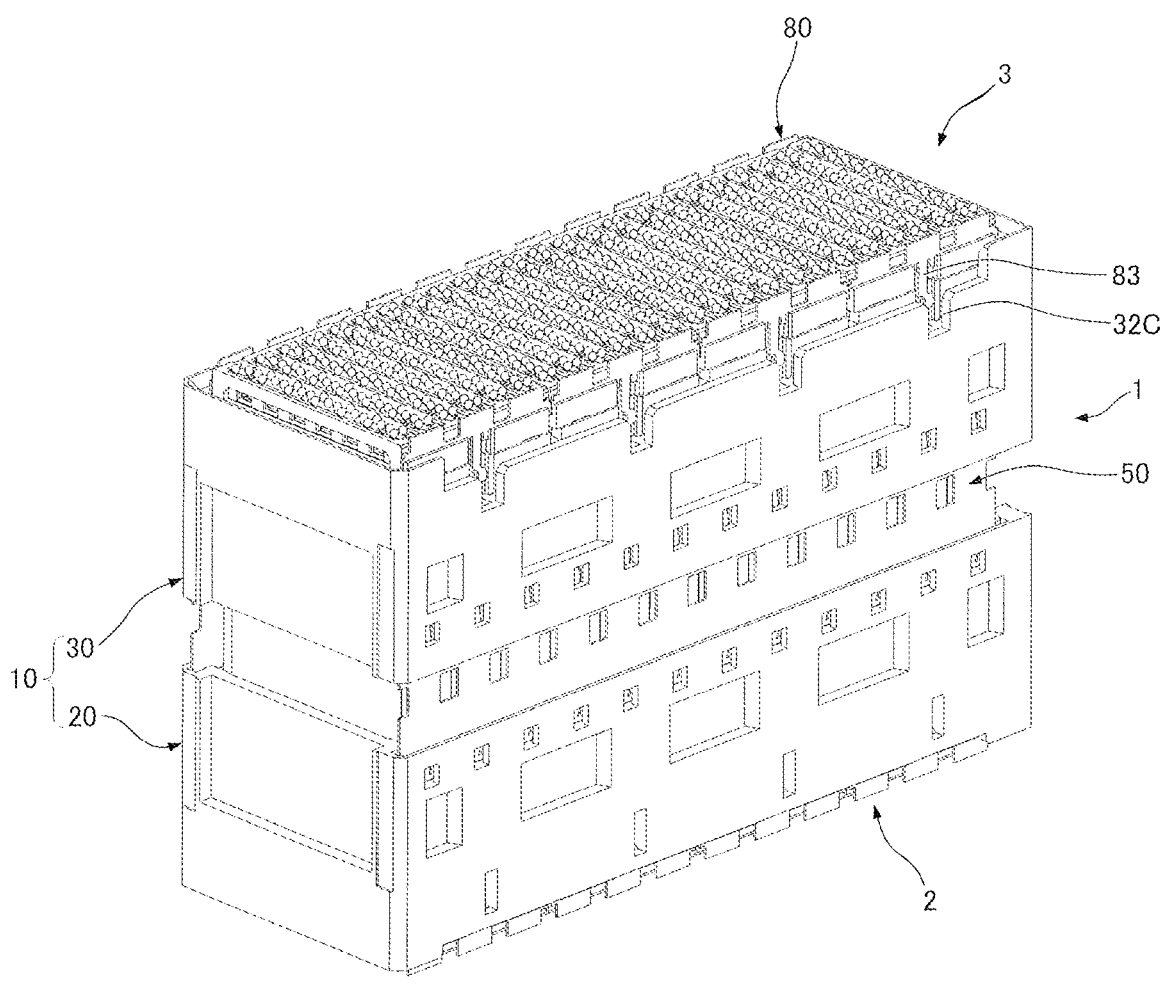
FIG. 2 illustrates a perspective view illustrating the intermediate connector along with the board connectors, shown in a state after mating.

FIG. 1 and FIG. 2 are perspective views illustrating an intermediate electrical connector 1 according to an embodiment of the present invention (referred to as "intermediate connector 1" below) along with a first board connector 2 and a second board connector 3 used as counterpart connect bodies (if necessary, referred to collectively as "board connectors 2, 3" below), with FIG. 1 illustrating a state before mating, and FIG. 2 a state after mating. In the present embodiment, the intermediate connector 1 and board connectors 2, 3 form a connector assembly that transmits high-speed differential signals. The board connectors 2, 3, which are electrical connectors for circuit boards deployed on respective different circuit boards (not shown), are mated with the intermediate connector 1 in an orientation in which the surface of each circuit board is at right angles to the vertical direction, that is, the connector height direction (Z-axis direction). Specifically, the first board connector 2 is matingly connected to the intermediate connector 1 from below (side Z2) and the second board connector 3 is matingly connected thereto from above (side Z1), as a result of which the board connectors 2, 3 are connected via the intermediate connector 1. In the present embodiment, the board connectors 2, 3 are constituted by electrical connectors of exactly the same shape.

As can be seen in FIG. 1, the intermediate connector 1 has intermediate circuit boards 40 (referred to as "intermediate boards 40" below) used as a plurality of hereinafter-described plate-shaped intermediate bodies, a housing 10 made of plastics or other electrically insulating material that supports the plurality of intermediate boards 40 in a side-by-side arrangement at predetermined intervals in the through-thickness direction thereof (X-axis direction), and two hereinafter-described linking fittings 50 made of sheet metal.

The housing 10 has a generally rectangular parallelepiped-like external shape whose longitudinal direction (referred to as "connector length direction" below) is the array direction of the intermediate boards 40 (X-axis direction). The housing 10 has a lower housing 20 that supports the lower sections of the intermediate boards 40, and an upper housing 30 that supports the upper sections of the intermediate boards 40. As described below, the lower housing 20 and the upper housing 30 are coupled via the linking fittings 50.

Figure 3:
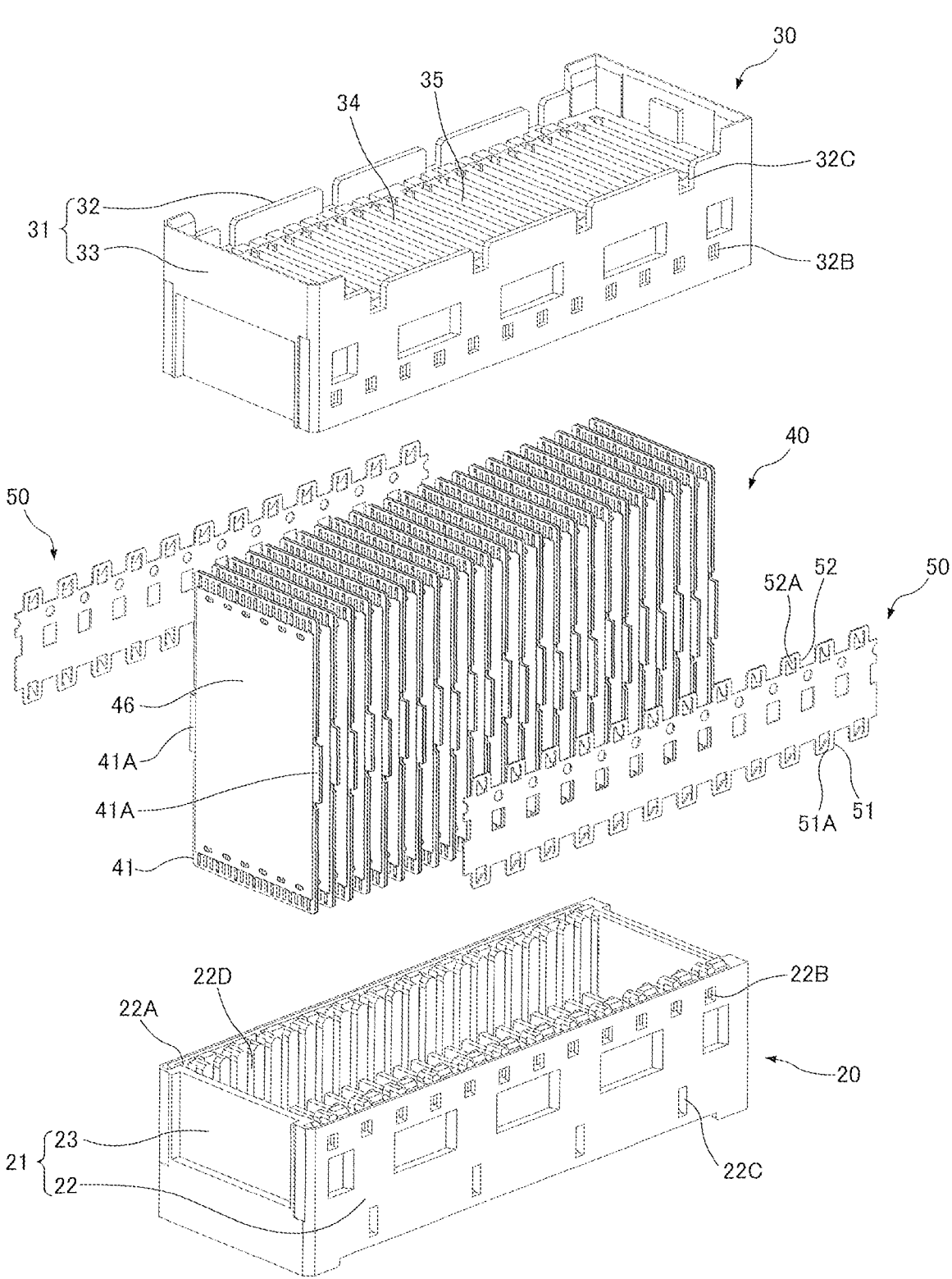
FIG. 3 illustrates a perspective view illustrating each component of the intermediate connector in isolation.

FIG. 3 is a perspective view illustrating each component of the intermediate connector 1 in isolation. As shown in FIG. 3, the lower housing 20 has a peripheral wall 21 that has a square frame-like configuration when viewed from above and surrounds the plurality of intermediate boards 40, and a plurality of lower intervening walls (not shown) for positioning the plurality of intermediate boards 40 at predetermined intervals in the connector length direction (X-axis direction). The peripheral wall 21 has two lower lateral walls 22 that extend in the connector length direction (X-axis direction), and two lower end walls 23 that extend in the connector width direction (Y-axis direction) perpendicular to the connector length direction and couple the end portions of the above-mentioned two lower lateral walls 22. Within the space enclosed by the peripheral wall 21, the lower intervening walls, which have a plate-shaped configuration with major faces perpendicular to the connector length direction and which couple the interior wall surfaces of the vertically intermediate portion of the two lower lateral walls 22, are formed in a side-by-side arrangement at predetermined intervals in the connector length direction (see the upper intervening walls 34 of the upper housing 30).

Slit-shaped spaces formed extending in the vertical direction between every two adjacent lower intervening walls or between the lower intervening walls and the lower end walls 23 constitute lower board accommodating spaces (not shown) used to accommodate the lower sections of the intermediate boards 40. A lower receiving portion 26 enclosed by the peripheral wall 21 is formed underneath said lower board accommodating spaces (see FIG. 8), and the first board connector 2 can be received within said lower receiving portion 26 from below.

As shown in FIG. 3, lower groove portions 22A used to receive the bottom portions of the linking fittings 50 are formed extending in the connector length direction in the top portion of the lower lateral walls 22 at intermediate locations in the thickness direction of the lower lateral walls 22, i.e., in the connector width direction (Y-axis direction). A plurality of lower engaging aperture portions 22B passing through the lower lateral walls 22 in the wall thickness direction thereof are formed at predetermined intervals in the connector length direction (X-axis direction) in the wall portion located outwardly of the lower groove portions 22A in the connector width direction in the top portion of the lower lateral walls 22. The lower engaging aperture portions 22B can lockingly engage the hereinafter-described lower engaging pieces 51A of the linking fittings 50.

Figure 8:
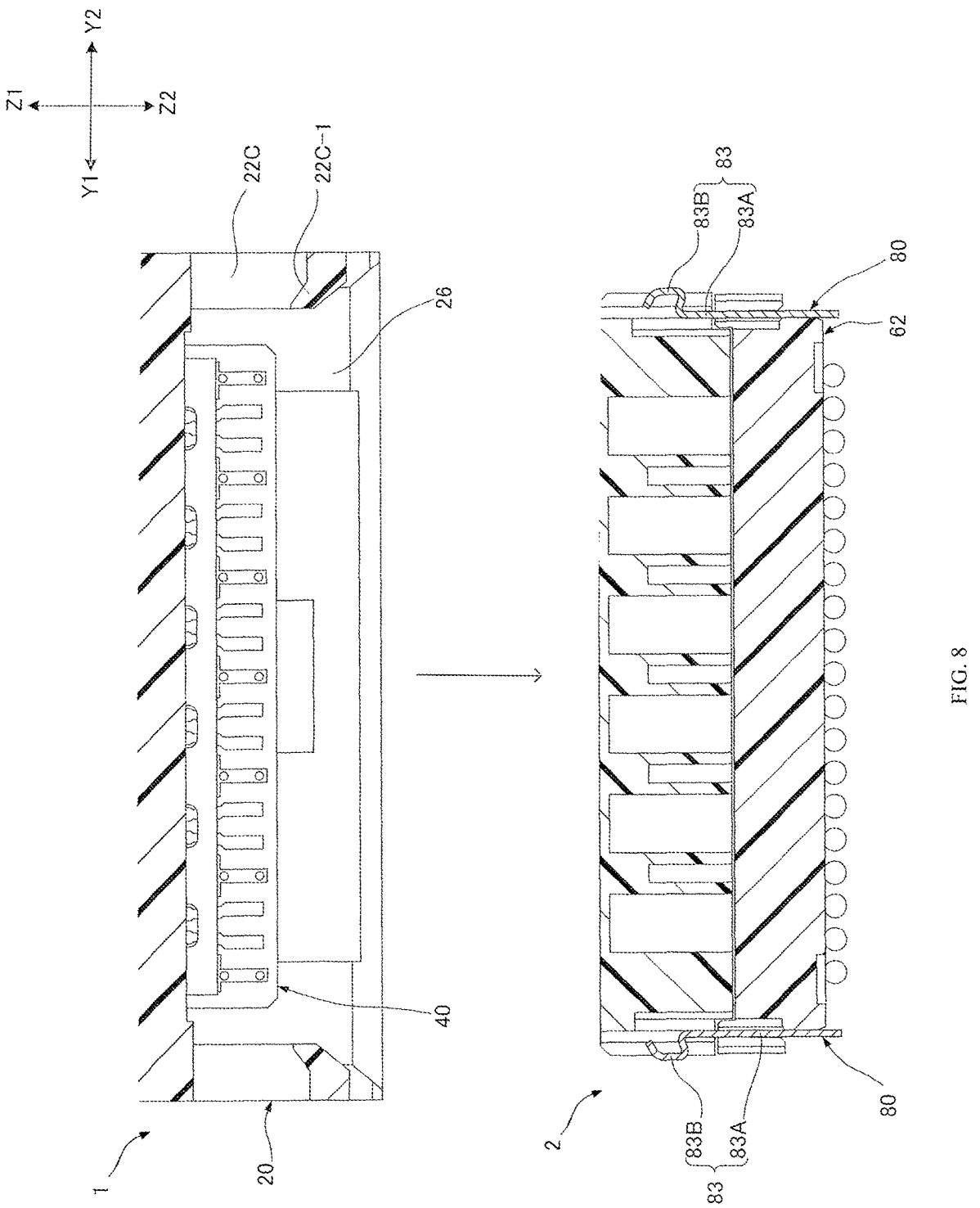
FIG. 8 illustrates a cross-sectional view of the first board connector and the bottom portion of the intermediate connector taken in a plane perpendicular to the array direction of the intermediate electrical connector, shown in a state before mating.

A plurality of lockable aperture portions 22C disposed through the lower lateral walls 22 in the wall thickness direction thereof (Y-axis direction) are formed in the bottom portion of the lower lateral walls 22 at predetermined intervals in the connector length direction (X-axis direction). As shown in FIG. 8, lockable portions that are lockingly engageable with the hereinafter-described locking portions 83B of the first board connector 2 are formed in the sections that form the bottom edge portions of the lockable aperture portions 22C. The lockable portions 22C-1 have a claw-like configuration that extends at an upward incline as one moves inwardly in the connector width direction.

Figure 6:
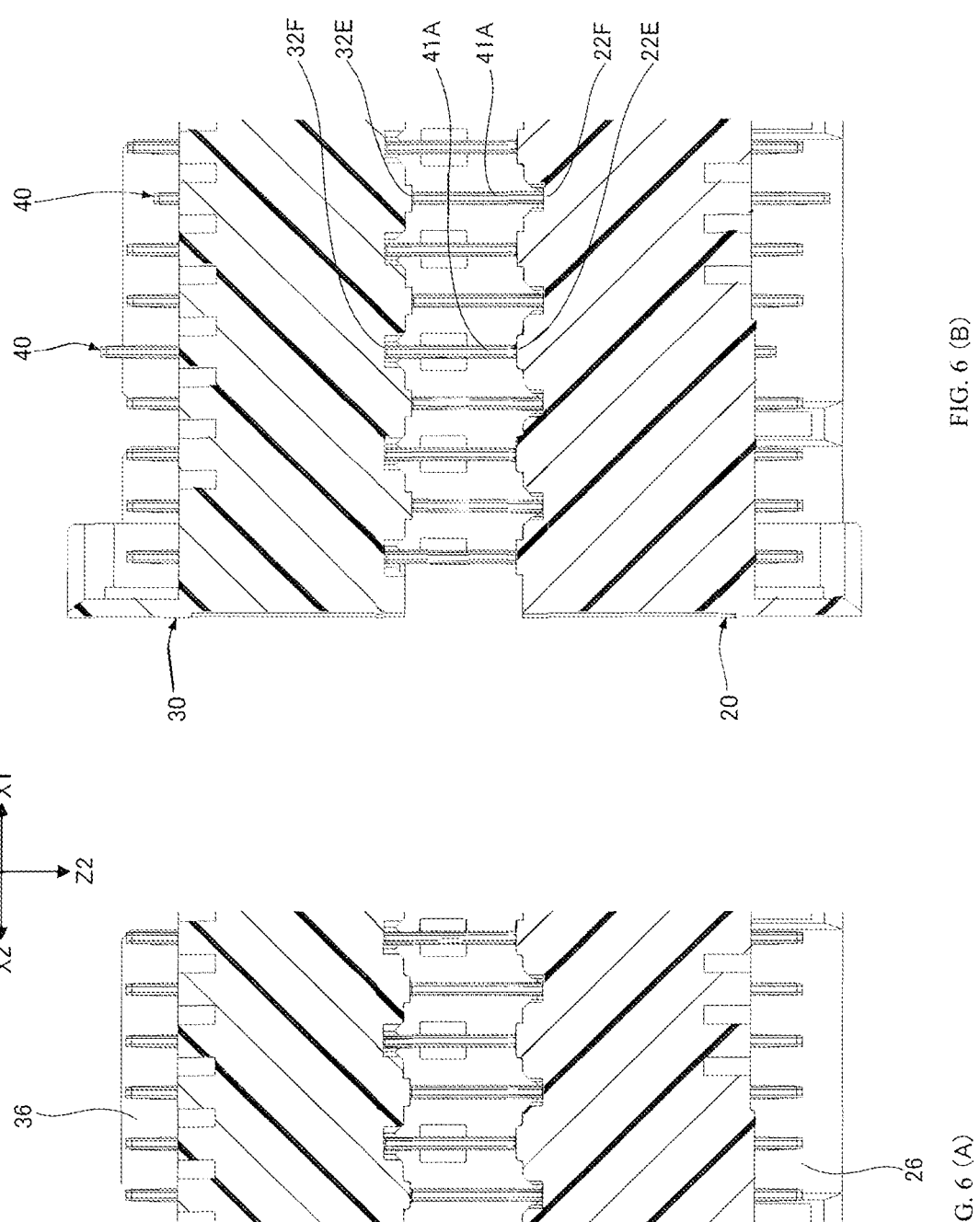
FIGS. 6 (A) and 6 (B) illustrate cross-sectional views taken in a plane perpendicular to the connector width direction at the locations of the lower lateral walls and upper lateral walls of the intermediate connector, with FIG. 6 (A) showing a state in which all the intermediate boards are disposed correctly, and FIG. 6 (B) a state in which some of the intermediate boards are disposed incorrectly.

As shown in FIG. 3, slits 22D that accommodate the lateral edges (edge portions extending in the vertical direction) of the intermediate boards 40 are formed extending in the vertical direction in the interior surface of the lower lateral walls 22. In addition, as shown in FIG. 6 (A) and FIG. 6 (B), first lower supporting portions 22E and second lower supporting portions 22F that are used to support the hereinafter-described supported portions 41A of the intermediate boards 40 from below are provided in the top portion of the lower lateral walls 22 at locations between the lower groove portions 22A and slits 22D in the connector width direction (Y-axis direction). The first lower supporting portions 22E and second lower supporting portions 22F are provided in an alternating manner in the connector length direction, with the first lower supporting portions 22E being positioned protruding upwardly from the second lower supporting portions 22F by a predetermined dimension P. The first lower supporting portions 22E and second lower supporting portions 22F, whose top end faces are flat faces perpendicular to the vertical direction, are adapted to support the hereinafter-described supported portions 41A of the intermediate boards 40 from below with their top end faces.

As shown in FIG. 1, FIG. 2, FIG. 3, and FIG. 6 (A) and FIG. 6 (B), the upper housing 30, which is similar in shape to the lower housing 20, is provided in an orientation in which it is vertically inverted with respect to the lower housing 20. In these figures, the sections of the upper housing 30 that correspond to the respective components of the lower housing 20 are indicated by assigning reference numerals obtained by adding "10" to the reference numerals used in the lower housing 20. The description herein will focus on the sections that are different from the lower housing 20. The upper housing 30 accommodates the upper sections of the intermediate boards 40 within slit-shaped upper board accommodating spaces 35 formed between every two adjacent upper intervening walls 34 or between the upper intervening walls 34 and the end walls 33. In addition, an upper receiving portion 36 enclosed by a peripheral wall 31 is formed above the upper board accommodating spaces 35, and the second board connector 3 can be received within said upper receiving portion 36 from above. As shown in FIG. 3, the upper housing 30 has upwardly open notched portions 32C formed at locations corresponding to the lockable aperture portions 22C of the lower housing 20. In other words, sections equivalent to the lockable portions 22C-1 of the lower housing 20 are not provided in the upper housing 30.

As shown in FIG. 6 (A) and FIG. 6 (B), first upper supporting portions 32E and second upper supporting portions 32F used to support the intermediate boards 40 from above are provided in the upper housing 30 in the bottom portion of the upper lateral walls 32. The first upper supporting portions 32E and second upper supporting portions 32F are provided in an alternating manner in the connector length direction, with the first upper supporting portions 32E positioned at the same locations in the connector length direction as the second lower supporting portions 22F and the second upper supporting portions 32F positioned at the same locations in the connector length direction as the first lower supporting portions 22E. The first upper supporting portions 32E and second upper supporting portions 32F, whose shapes are respective vertical inversions of the first lower supporting portions 22E and second lower supporting portions 22F, are adapted to support the hereinafter-described supported portions 41A of the corresponding intermediate boards 40 from above with their bottom end faces (flat faces).

In the present embodiment, the first upper supporting portions 32E are positioned protruding downwardly from the second upper supporting portions 32F by a predetermined dimension P. In other words, the dimension P by which the first upper supporting portions 32E protrude downwardly from the second upper supporting portions 32F is equal to the dimension P by which the first lower supporting portions 22E protrude upwardly from the second lower supporting portions 22F.

The linking fittings 50 are made by stamping and partially bending a sheet metal member. As shown in FIG. 3, a single linking fitting 50 is provided on each opposite side of the intermediate boards 40 in the connector width direction in an orientation in which it extends longitudinally in the connector length direction (X-axis direction) and the through-thickness direction thereof coincides with the connector width direction (Y-axis direction). Lower tabs 51 that are capable of entering the lower groove portions 22A from above are provided in a downwardly protruding configuration at the bottom end of the linking fittings 50 at locations corresponding to the lower engaging aperture portions 22B of the lower housing 20 in the connector length direction. The lower engaging pieces 51A are formed in the lower tabs 51 by cutting out and lifting a portion thereof outwardly in the connector width direction. The lower engaging pieces 51A are adapted to enter the lower engaging aperture portions 22B and lockingly engage the top edge portions of said lower engaging aperture portions 22B from below. In the same manner as the lower tabs 51 and lower engaging pieces 51A, upper tabs 52 that are capable of entering the upper groove portions of the upper housing 30, and upper engaging pieces 52A that are capable of entering the upper engaging aperture portions 32B and lockingly engaging the bottom edge portions of said upper engaging aperture portions 32B from above are provided at the top ends of the linking fittings 50.

As shown in FIG. 3, the intermediate boards 40 have a plate-shaped substrate 41 made of plastic or another electrically insulating material, a plurality of signal transmission line pairs 42, 44 for differential signal transmission used as electrically conductive lines formed in an array on the substrate 41 (see FIG. 4 and FIG. 5), and ground layers 46 formed so as to cover both major faces of the substrate 41 (faces perpendicular to the through-thickness direction (X-axis direction)). The signal transmission line pairs 42, 44 each have electrically conductive patterns that extend along the major faces of the substrate 41 and vias that are provided within the thickness thereof and connect the electrically conductive patterns. In the present embodiment, a plurality of intermediate boards 40 are provided in an orientation in which every two intermediate boards 40 adjacent in the connector length direction are vertically inverted relative to each other. As used herein with respect to the intermediate boards 40, the phrase "vertically invert" refers to rotating the intermediate boards 40 through 180° about an axis passing in the X-axis direction through the center of the faces of the intermediate boards 40 (faces perpendicular to the X-axis direction) while keeping said faces in place.

Figure 4:
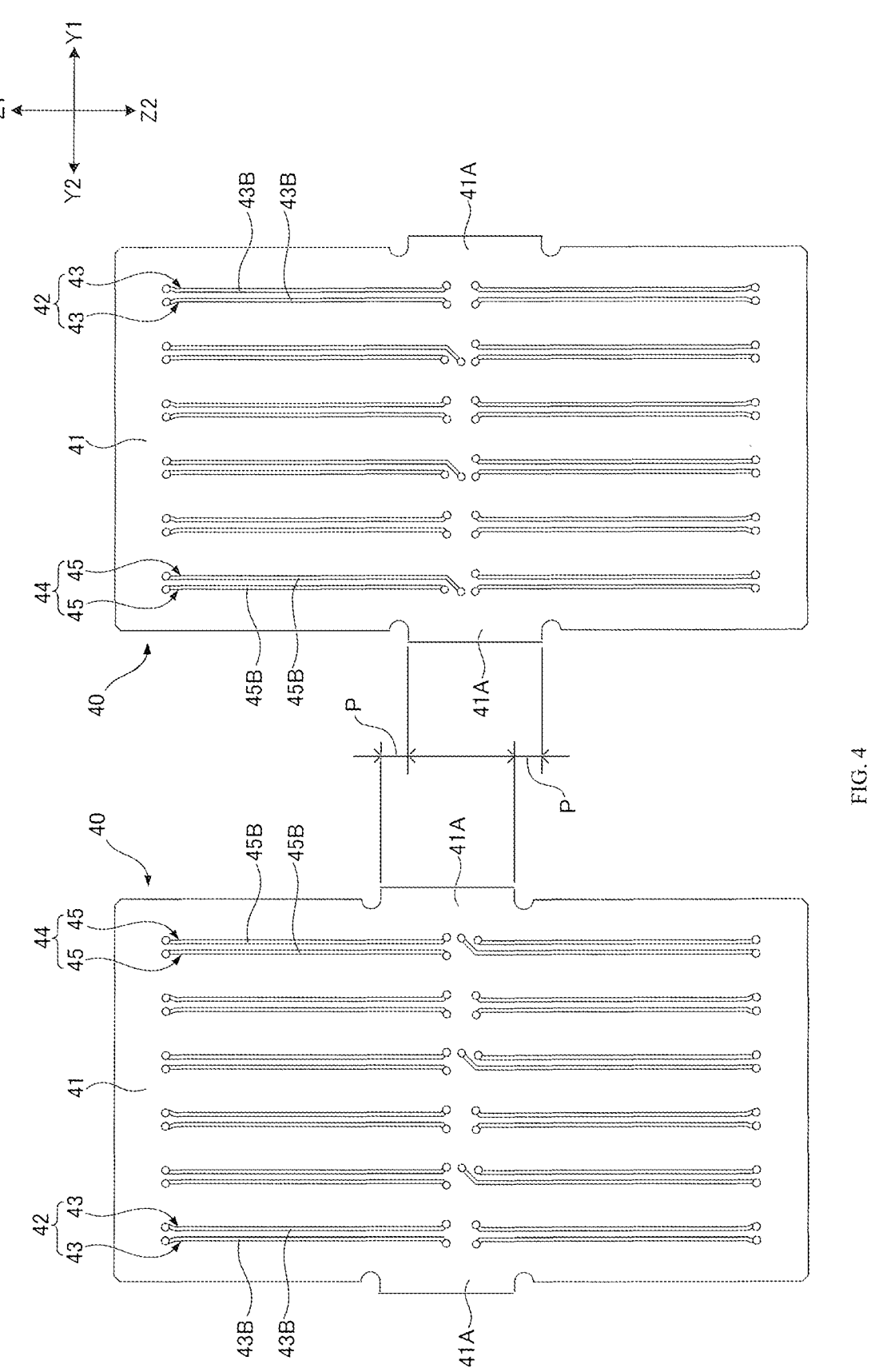
FIG. 4 illustrates a front view illustrating two intermediate boards vertically inverted relative to each other in a side-by-side arrangement.

As shown in FIG. 3, at the lateral edges extending in the vertical direction at the opposite ends in the connector width direction, the substrate 41 has supported portions 41A protruding outwardly in the connector width direction at the same locations as each other in the vertical direction. The supported portions 41A are provided at locations offset from the middle towards one side of the substrate 40 in the vertical direction. As shown in FIG. 6 (A) and FIG. 6 (B), the supported portions 41A of the intermediate boards 40 are adapted to be supported from below by the first lower supporting portions 22E or second lower supporting portions 22F of the lower housing 20 and from above by the first upper supporting portions 32E or second upper supporting portions 32F of the upper housing 30. As shown in FIG. 4, in the case of two vertically inverted intermediate boards 40, the supported portions 41A are positioned so as to differ by a predetermined dimension P in the vertical direction. This predetermined dimension P is equal to the predetermined dimension P by which the first lower supporting portions 22E protrude upwardly from the second lower supporting portions 22F (see FIG. 6 (A)), and also equal to the predetermined dimension P by which the first upper supporting portions 32E protrude downwardly from the second upper supporting portions 32F (see FIG. 6 (A)).

Figure 5:
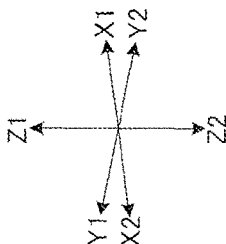
FIG. 5 illustrates a perspective view illustrating only signal transmission line pairs provided in three intermediate boards in a side-by-side arrangement.
Figure 5:
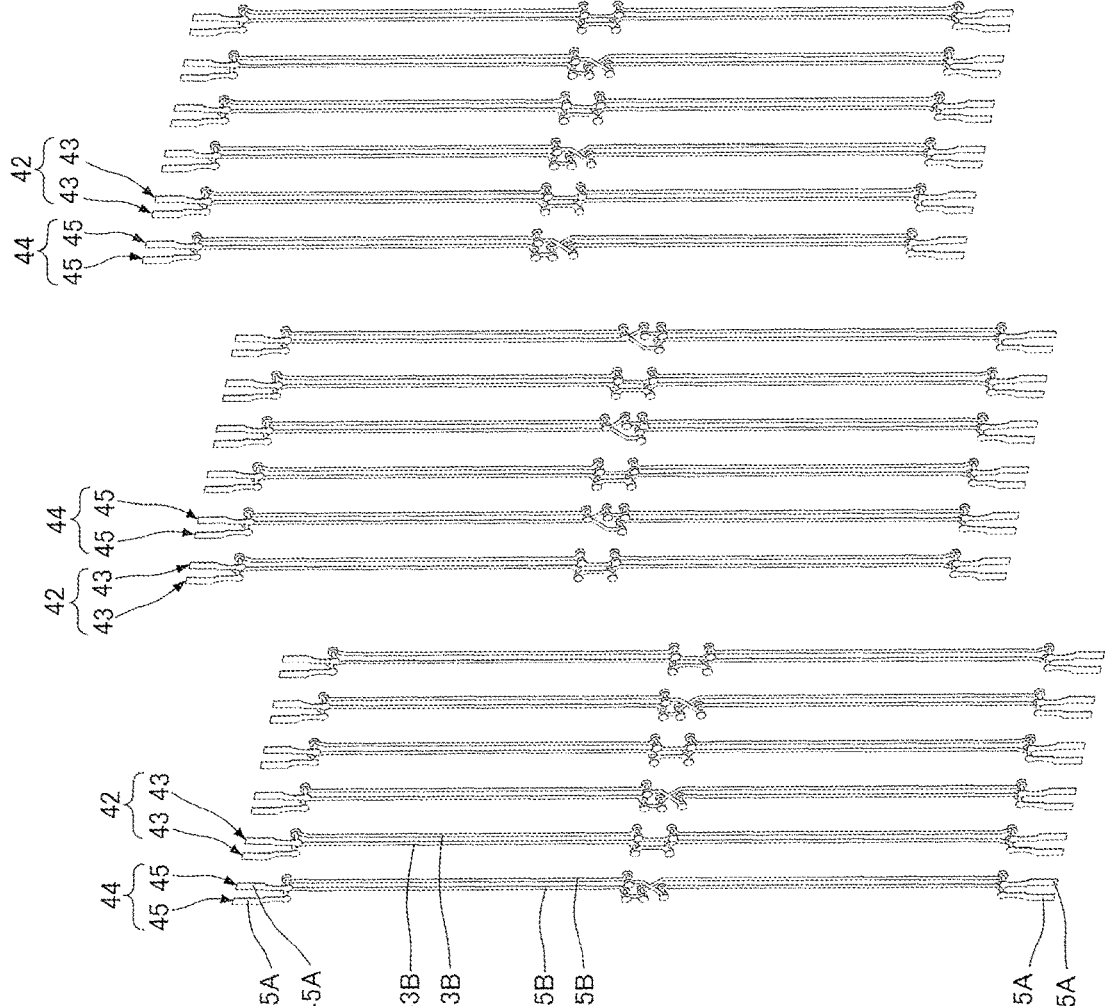

As shown in FIG. 4 and FIG. 5, the signal transmission line pairs 42, 44 have two types of pairs, that is, straight pairs 42 and cross pairs 44. In the present embodiment, there are three straight pairs 42 and three cross pairs 44 disposed in an alternating manner in the connector width direction (Y-axis direction).

The straight pairs 42 have a pair of (two) straight patterns (straight lines) 43 extending in a spaced relationship without intersecting each other all the way from one end to the other end in the vertical direction. When viewed in the through-thickness direction (X-axis direction) of the substrate 41, the pairs of straight patterns 43 are laterally and vertically symmetrical to each other. As shown in FIG. 5, the straight patterns 43 have signal connection portions 43A that are used for connecting to the board connectors 2, 3; a plurality of thin ridge portions 43B separately extending in the vertical direction; and a plurality of signaling vias extending through the thickness of the substrate 41 in the through-thickness direction (X-axis direction). The signal connection portions 43A and the plurality of thin ridge portions 43B are coupled to one another by the signaling vias, owing to which the straight patterns 43 are formed in two layers within the thickness of the substrate 41. Although in the present embodiment the straight pairs 42 are constituted by pairs of straight patterns 43 that do not intersect each other, as an alternative, the straight pairs may be constituted by pairs of straight patterns having intersection portions in which intersection takes place with no contact at an even number of locations of said straight pairs in the longitudinal direction.

The cross pairs 44 have a pair of (two) cross patterns (cross-lines) 45 intersecting with no contact at an intermediate location in the vertical direction. When viewed in the through-thickness direction of the substrate 41, the pairs of cross patterns 45 are laterally and vertically asymmetrical to each other. In the same manner as the straight patterns 43, the cross patterns 45 also have signal connection portions 45A that are used for connecting to the board connectors 2, 3; a plurality of thin ridge portions 45B separately extending in the vertical direction; and a plurality of signaling vias extending through the thickness of the substrate 41 in the through-thickness direction (X-axis direction). The signal connection portions 45A and the plurality of thin ridge portions 45B are coupled to one another by the signaling vias, owing to which the cross patterns 45 are formed in two layers within the thickness of the substrate 41. Although in the present embodiment the cross patterns 45 of the cross pairs 44 intersect with no contact at a single location in the longitudinal direction of the cross pairs 44, the number of locations where intersection portions are formed is not limited to a single location and may be an odd number of locations.

As shown in FIG. 3, the ground layers 46, which are constituted by metallic layers, are formed over substantially the entire area of the respective major faces of the substrate 41.

The intermediate connector 1 is assembled in accordance with the following procedure. First, the intermediate boards 40 are inserted and placed in the lower board accommodating spaces of the lower housing 20 from above one by one. At this time, the intermediate boards 40 are disposed such that intermediate boards 40 adjacent to each other are provided in a vertically inverted manner and the respective supported portions 41A are supported by the first lower supporting portions 22E or by the second lower supporting portions 22F from below. Specifically, as shown in FIG. 6 (A), the intermediate boards 40 oriented such that the supported portions 41A are positioned with an upward offset are disposed such that their supported portions 41A are supported by the first lower supporting portions 22E, and the intermediate boards 40 oriented such that the supported portions 41A are positioned with a downward offset are disposed such that their supported portions 41A are supported by the second lower supporting portions 22F.

Further, the linking fittings 50 are attached to the lower housing 20. Specifically, the lower tabs 51 of the linking fittings 50 are inserted into the lower groove portions 22A of the lower housing 20 from above. At this time, as a result of abutting the interior wall surface of the lower groove portions 22A in the process of insertion, the lower engaging pieces 51A undergo resilient deformation inwardly in the connector width direction, and thereafter, upon reaching the locations of the lower engaging aperture portions 22B, return to a free state and enter the lower engaging aperture portions 22B. As a result, the lower engaging pieces 51A are enabled to lockingly engage the top edges of the lower engaging aperture portions 22B from below, which completes the attachment of the linking fittings 50.

Next, the upper housing 30 is brought from above the intermediate boards 40 disposed in the lower housing 20 and, while the top portions of the intermediate boards 40 are inserted and placed in the upper board accommodating spaces 35 of the upper housing 30 from below, the linking fittings 50 are attached to the upper housing 30 from below. As shown in FIG. 6 (A), the intermediate boards 40 oriented such that the supported portions 41A are positioned with an upward offset have their supported portions 41A supported from above by the second upper supporting portions 32F, and the intermediate boards 40 oriented such that the supported portions 41A are positioned with a downward offset have their supported portions 41A supported from above by the first upper supporting portions 32F.

Further, the attachment of the linking fittings 50 to the upper housing 30 is carried out in accordance with the same procedure as the previously discussed attachment of the linking fittings 50 to the lower housing 20. Once the linking fittings 50 have been attached, the upper engaging pieces 52A are enabled to lockingly engage the bottom edges of the upper engaging aperture portions 32B of the upper housing 30 from above, which completes the assembly of the intermediate connector 1.

As discussed previously, in the present embodiment, every two supported portions 41A of two intermediate boards 40 vertically inverted relative to each other are positioned so as to differ by a predetermined dimension P in the vertical direction. In addition, the first lower supporting portions 22E and second lower supporting portions 22F are positioned so as to differ by a predetermined dimension P in the vertical direction. Therefore, as shown in FIG. 6 (A), if the intermediate boards 40 are disposed in the correct orientation such that adjacent intermediate boards 40 are vertically inverted, the top ends of all the intermediate boards 40 will be positioned at the same height in the vertical direction. Therefore, using visual inspection, the operator will be able to easily determine that these intermediate boards 40 are disposed in the correct orientation.

As shown in FIG. 6 (B), if there is an intermediate board 40 placed incorrectly in an orientation not inverted relative to the adjacent intermediate boards 40 among the plurality of intermediate boards 40, then the top end of this intermediate board 40 will be positioned at an offset upwardly or downwardly from the other intermediate boards 40. For example, if an intermediate board 40 oriented such that the supported portions 41A are positioned with an upward offset is disposed at the location of a second lower supporting portion 22F in the connector length direction, the top end of the intermediate board 40 will be positioned lower than the top ends of the other intermediate boards 40 (see the second intermediate board 40 from the right in FIG. 6 (B)). Further, if an intermediate board 40 oriented such that the supported portions 41A are positioned with a downward offset is disposed at the location of a first lower supporting portion 22E in the connector length direction, the top end of the intermediate board 40 will be positioned higher than the top ends of the other intermediate boards 40 (see the fifth intermediate board 40 from the right in FIG. 6 (B)).

Therefore, the operator will be able to easily identify via a visual inspection that an intermediate board 40 has been placed incorrectly. The fact that an intermediate board 40 has been placed incorrectly can be determined when the intermediate boards 40 are placed in the lower housing 20 and any time after completing the assembly of the intermediate connector 1. Should such an incorrect placement occur, the intermediate board 40 may be correctly re-placed in the lower housing 20 after vertically inverting it.

As discussed previously, when the intermediate boards 40 are vertically inverted in the present embodiment, as shown in FIG. 4 and FIG. 5, straight pairs 42 in an inverted state are positioned at locations corresponding to cross pairs 44 in a non-inverted state, and cross pairs 44 in an inverted state are positioned at locations corresponding to straight pairs 42 in a non-inverted state. Therefore, once the plurality of intermediate boards 40 have been arranged side by side in the housing 10, any two adjacent intermediate boards 40 will have the cross pairs 44 of one intermediate board 40 disposed at locations corresponding to the straight pairs 42 of the other intermediate board 40, and the straight pairs 42 of the first intermediate board 40 will be disposed at locations corresponding to the cross pairs 44 of the other intermediate board 40. In other words, since the straight pairs 42 and cross pairs 44 are disposed in a staggered configuration when the plurality of the intermediate boards 40 are viewed as a whole, and FEXT (far end cross-talk) between intermediate boards 40 is adequately reduced.

It should be noted that although in the present embodiment the straight pairs 42 and cross pairs 44 in two intermediate boards 40 that are oriented so as to be vertically inverted relative to each other are aligned with each other as a result of being positioned at the same locations in the connector width direction, it is not essential for them to be positioned at the same locations. The straight pairs 42 and cross pairs 44 may be aligned while being positioned with a slight offset in the connector width direction. In addition, although in the present embodiment the straight pairs 42 and cross pairs 44 are disposed in an alternating manner, it is not essential for them to be disposed in an alternating manner; the straight pairs 42 and cross pairs 44 may be disposed in mutual alignment.

Figure 7:
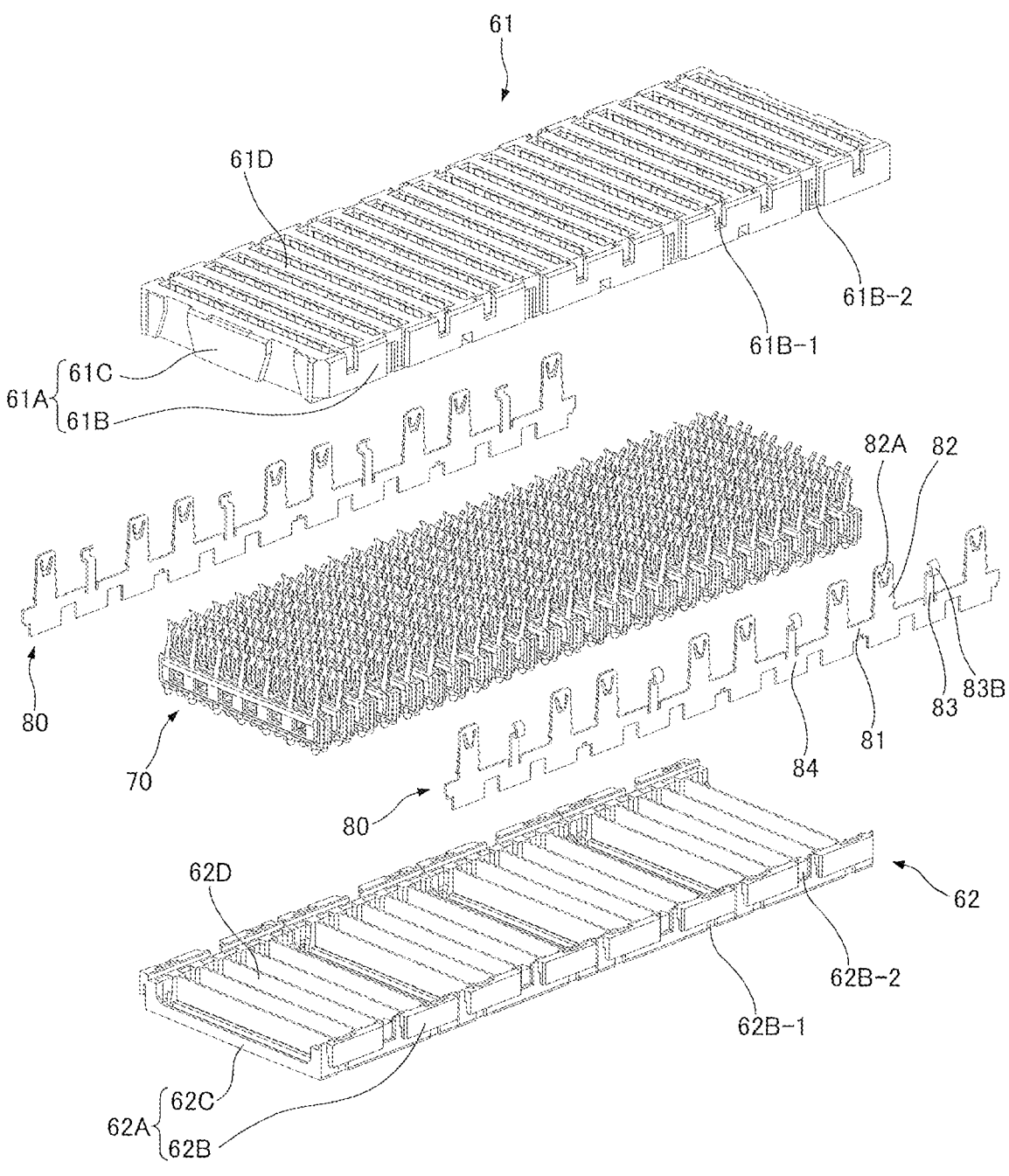
FIG. 7 illustrates a perspective view illustrating each component of the first board connector in isolation.

The configuration of the board connectors 2, 3 will be described next. Since the board connectors 2, 3 have exactly the same configuration, as can be seen in FIG. 1, the description below will focus on the configuration of the first board connector 2, and the description of the second board connector 3 will be omitted, with the proviso that the same reference numerals are assigned for it as in the first board connector 2. FIG. 7 is a perspective view illustrating each component of the first board connector 2 in isolation. As can be seen in FIG. 1 and FIG. 7, the first board connector 2 has a housing 60 formed in a rectangular parallelepiped-like external shape adapted for the lower receiving portion 26 (see FIG. 8) of the lower housing 20 of the intermediate connector 1, a plurality of terminal retainers 70 retained in an array in the housing 60, and two coupling fittings 80 made of sheet metal extending in the connector length direction on the opposite sides of the terminal retainers 70 in the connector width direction.

As shown in FIG. 1, the housing 60, which is made of plastic or another electrically insulating material, has a generally rectangular parallelepiped-like external shape whose longitudinal direction (connector length direction) is the array direction (X-axis direction) of the terminal retainers 70. As shown in FIG. 1 and FIG. 7, the housing 60 has an upper housing 61 and a lower housing 62 formed by splitting in the vertical direction. The upper housing 61 and lower housing 62 are coupled via the coupling fittings 80. The housing 60 accommodates and retains in place a plurality of terminal retainers 70 arranged side by side in the connector length direction.

As shown in FIG. 7, the upper housing 61 has an upper peripheral wall 61A of a square frame-like configuration when viewed in the vertical direction, and a plurality of upper intervening walls 61D extending in the connector width direction (Y-axis direction) within the space enclosed by the upper peripheral wall 61A. The upper peripheral wall 61A has two upper lateral walls 61B that extend along the connector length direction (X-axis direction), and two upper end walls 61C that extend in the connector width direction (Y-axis direction) and couple the end portions of the two upper lateral walls 61B. The plurality of upper intervening walls 61D extend in the connector width direction and couple the interior wall surfaces of the two upper lateral walls 61B. Groove-shaped upper coupling groove portions 61B-1 extending in the vertical direction are formed in the upper lateral walls 61B at a plurality of locations spaced apart in the connector length direction. Groove-shaped upper locking groove portions 61B-2 extending in the vertical direction are formed in the upper lateral walls 61B at a plurality of locations other than those of the upper coupling groove portions 61B-1 in the connector length direction.

The lower housing 62 retains in place the plurality of terminal retainers 70 arranged side by side at equal intervals in the connector length direction (X-axis direction). In the same manner as the upper housing 61, the lower housing 62 also has a lower peripheral wall 62A of a square frame-like configuration and a plurality of lower intervening walls 62D extending in the connector width direction (Y-axis direction). In addition, in the same manner as the upper peripheral wall 61A, the lower peripheral wall 62A has two lower lateral walls 62B that extend in the connector length direction and two lower end walls 62C that extend in the connector width direction.

Groove-shaped lower coupling groove portions 62B-1 that extend in the vertical direction and are placed in communication with the upper coupling groove portions 61B-1 are formed in the lower lateral walls 62B at the same locations as the upper coupling groove portions 61B-1 of the upper housing 61 in the connector length direction. In addition, groove-shaped lower locking groove portions 62B-2 that extend in the vertical direction and are placed in communication with the upper locking groove portions 61B-2 are formed in the lower lateral walls 62B at the same locations as the upper locking groove portions 61B-2 of the upper housing 61 in the connector length direction.

As shown in FIG. 7, the terminal retainers 70 have a plurality of signal terminals made of sheet metal arranged side by side in the connector width direction, a plurality of ground members made of sheet metal provided extending in the connector width direction, and retaining members made of plastic or another electrically insulating material for retaining the signal terminals and ground terminals. The signal terminals can contact the signal connection portions 43A or signal connection portions 45A formed in the bottom portion of the intermediate boards 40 of the intermediate connector 1 with their top ends and can also be soldered to the corresponding circuits of the circuit boards with their bottom ends. The ground members can contact the ground layers 46 formed on the intermediate boards 40 of the intermediate connector 1 with their top ends and can also be soldered to the corresponding circuits of the circuit board with their bottom ends.

As shown in FIG. 7, the coupling fittings 80 are made by stamping and partially bending in the through-thickness direction a sheet metal member extending in the connector length direction (X-axis direction). The coupling fittings 80 are provided in an orientation in which they extend over the entire array range of the terminal retainers 70 in the connector length direction and have major faces perpendicular to the connector width direction on the opposite sides of the first board connector 2 in the connector width direction. Since in the present embodiment the coupling fittings 80 are constituted by plate-like members provided in this type of orientation, the dimensions of the coupling fittings 80 in the connector width direction can be limited to the through-thickness dimensions of said coupling fittings 80 and, as a result, an increase in the size of the first board connector 2 in the connector width direction can be avoided.

The coupling fittings 80 have a lateral plate portion 81 that extends in the connector length direction, a plurality of engaging arm portions 82 and locking arm portions 83 that extend upwardly from the lateral plate portion 81 at a plurality of locations in the connector length direction, and a plurality of anchor portions 84 that extend downwardly from the lateral plate portion 81 at a plurality of locations in the connector length direction.

The engaging arm portions 82 are provided at locations corresponding to the lower coupling groove portions 62B-1 and upper coupling groove portions 61B-1 of the upper housing 61 in the connector length direction. The engaging arm portions 82, which have formed therein engaging pieces 82A that are obtained by cutting out and raising a portion thereof outwardly in the connector width direction, are adapted to lockingly engage stepped portions formed in the upper lateral walls 61B of the upper housing 61 with the aid of said engaging pieces 82A.

The locking arm portions 83 are provided at locations corresponding to the lower locking groove portions 62B-2 and upper locking groove portions 61B-2 of the upper housing 61. The locking arm portions 83, which are constituted by resilient pieces that are resiliently deformable in the connector width direction, are lockingly engageable with the lockable portions 22C-1 of the lower housing 20 of the intermediate connector 1 in the vertical direction (see FIG. 9 (B)). Specifically, as shown in FIG. 8, the locking arm portions 83 have a rectilinear portion 83A that extends rectilinearly in the vertical direction and a locking portion 83B that extends in a curved fashion from the top end of said rectilinear portion 83A. The rectilinear portion 83A is resiliently deformable in its through-thickness direction, that is, in the connector width direction. The locking portion 83B is positioned outwardly from the rectilinear portion 83A in the connector width direction. The locking portion 83B is formed by bending such that, after bending at the top end of the rectilinear portion 83A and extending at an incline outwardly and downwardly in the connector width direction, it extends upwardly in a curved fashion and, furthermore, its top end portion (free end portion) extends inwardly and upwardly in the connector width direction. Since in the present embodiment the locking arm portions 83 in the coupling fittings 80 are provided at a plurality of locations in the connector length direction, the locking portions 83B can be lockingly engaged with the lockable portions 22C-1 of the intermediate connector 1 at these locations, and the locking strength between the first board connector 2 and intermediate connector 1 can be increased.

The anchor portions 84, which are provided at locations corresponding to each engaging arm portion 82 and locking arm portion 83 in the connector length direction, are adapted to be secured soldered to the corresponding portions of the circuit board at their bottom ends.

The first board connector 2 is assembled in accordance with the following procedure. First, terminal retainers 70 are inserted from above into the groove portions between adjacent lower intervening walls 62D, as well as between adjacent lower end walls 62C and lower intervening walls

62D in the lower housing 62, thereby causing the plurality of terminal retainers 70 to be retained in place in the lower housing 62 in a side-by-side arrangement in the connector length direction (X-axis direction). Further, the engaging arm portions 82 of the two coupling fittings 80 made of sheet metal are press-fitted into the lower coupling groove portions 62B-1 from below. At this time, the locking arm portions 83 enter the lower locking groove portions 62B-2 from below.

Furthermore, the upper housing 61 is attached to the lower housing 62 from above. At this time, the engaging arm portions 82 of the coupling fittings 80 are inserted into the upper coupling groove portions 61B-1 from below and the engaging pieces 82A are positioned in a manner permitting locking engagement with the above-mentioned stepped portions of the upper lateral walls 61B from above. As a result, the upper housing 61 and lower housing 62 are prevented from being disengaged. Further, at the same time, the locking arm portions 83 enter the upper locking groove portions 61B-2 from below. As a result, the locking arm portions 83 are accommodated in the upper locking groove portions 61B-2 and lower locking groove portions 62B-2 in a resiliently deformable state in the connector width direction. The attachment of the upper housing 61 in this manner completes the assembly of the first board connector 2. Further, the second board connector 3 is manufactured in accordance with the same procedure as the first board connector 2.

The operation of connector mating of the intermediate connector 1 and board connectors 2, 3 will be described next. First, the board connectors 2, 3 are soldered to the respective circuit boards. Next, as can be seen in FIG. 1, the intermediate connector 1 is positioned above the first board connector 2.

Next, as shown by an arrow in FIG. 8, the intermediate connector 1 is lowered and matingly connected to the first board connector 2. In the process of mating, the bottom faces of the lockable portions 22C-1 of the lower housing 20 abut the locking portions 83B of the locking arm portions 83 of the coupling fittings 80 from above. Since the bottom faces of the lockable portions 22C-1 are constituted by inclined faces tilted upwardly as one moves inwardly in the connector width direction, the locking portions 83B are pushed inwardly in the connector width direction. As a result, as shown in FIG. 9 (A), the locking arm portions 83 undergo resilient deformation inwardly in the connector width direction, thereby permitting further downwardly-directed movement of the intermediate connector 1.

Figure 9:
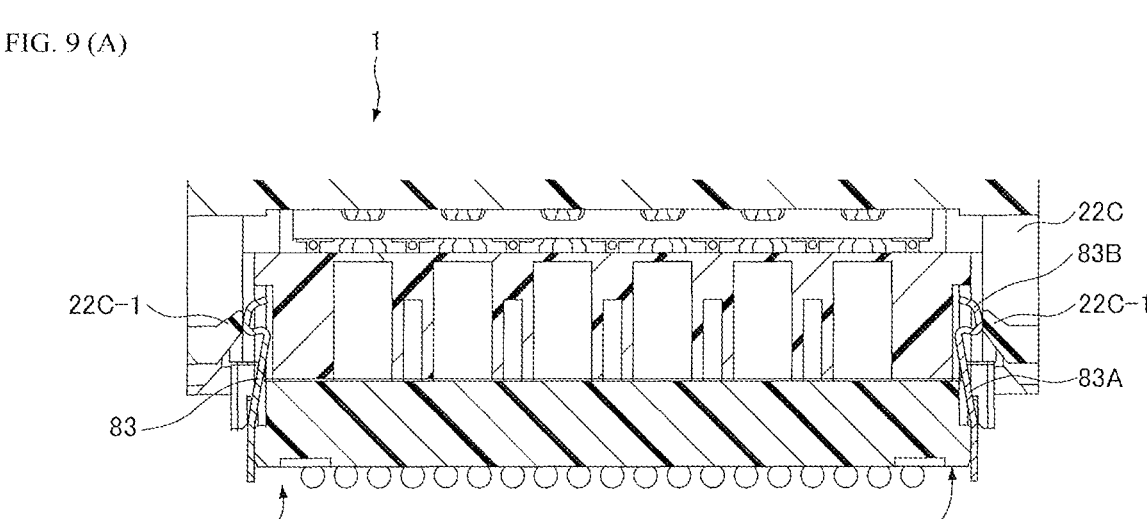
FIGS. 9 (A) to 9 (C) illustrate cross-sectional views of the first board connector and the bottom portion of the intermediate connector taken in a plane perpendicular to the array direction of the intermediate connector, with FIG. 9 (A) illustrating a state in the process of mating, FIG. 9 (B) a state before mating, and FIG. 9 (C) a state in the process of disengagement.
Figure 9:
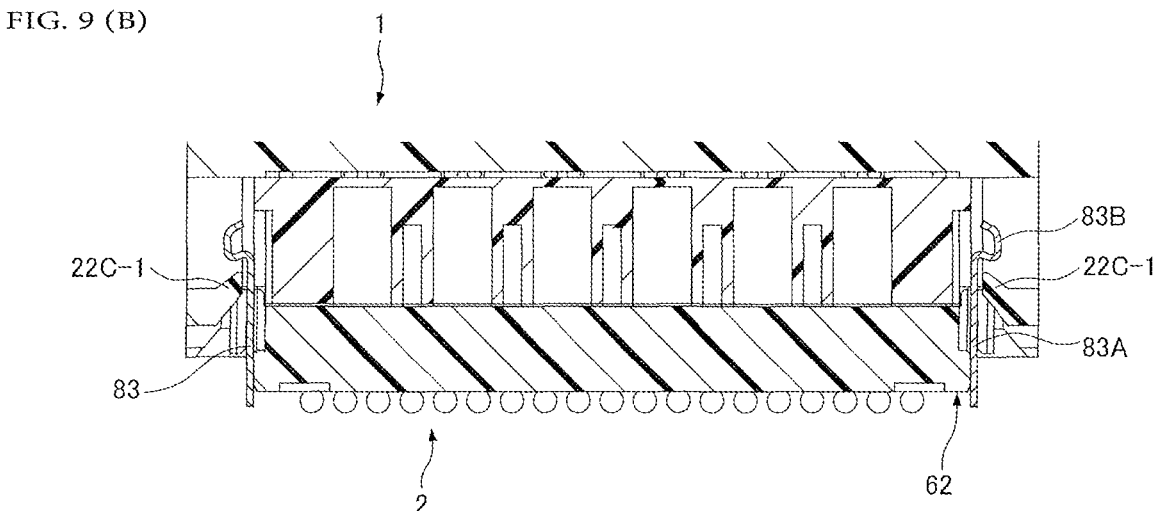
Figure 9:
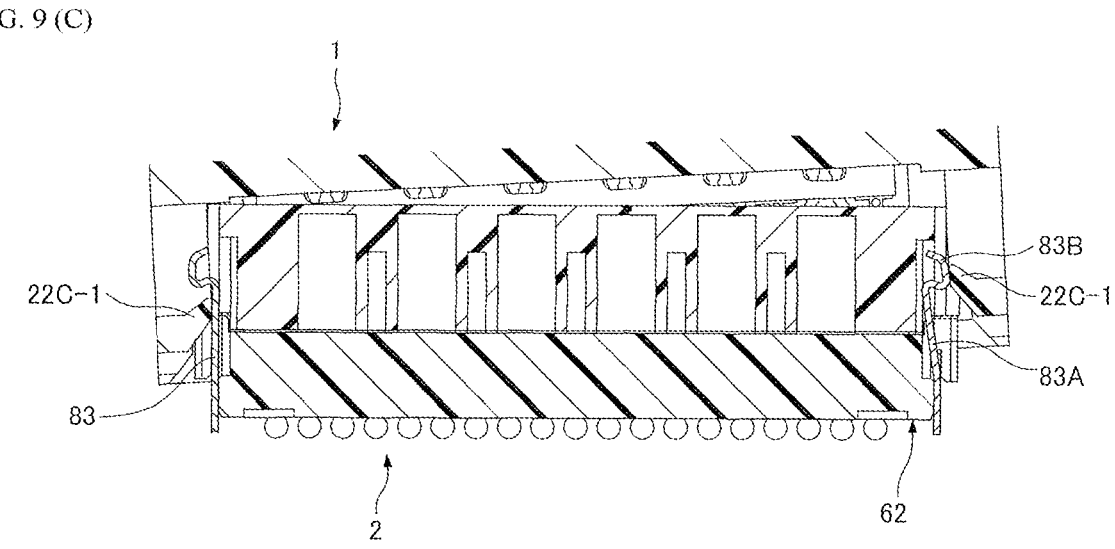

As shown in FIG. 9 (B), as the intermediate connector 1 moves further downward and the lockable portions 22C-1 pass the locations of the locking portions 83B, the locking arm portions 83 return to a free state, and the locking portions 83B are positioned directly above the lockable portions 22C-1. As a result, the lockable portions 22C-1 become lockingly engageable with the locking portions 83B from below, which produces a locked state that restricts the upward movement of the intermediate connector 1.

When the intermediate connector 1 is matingly connected to the first board connector 2, the signal terminals and ground terminals of the first board connector 2 come into contact with the ground layers 46, signal connection portions 45A, and signal connection portions 43A in the bottom portion of each intermediate board 40 under contact pressure, thereby entering an electrically conductive state.

Next, the second board connector 3 is matingly connected to the intermediate connector 1 from above in an orientation that is vertically inverted relative to the first board connector 2 (orientation illustrated in FIG. 1). As discussed previously, notched portions 32C are formed in the upper housing 30 of the intermediate connector 1 in the sections corresponding to the lockable aperture portions 22C of the lower housing 20. In other words, sections corresponding to the lockable portions 22C-1 of the lower housing 20 are absent from the upper housing 30. Therefore, the locking arm portions 83 of the second board connector 3 enter the notched portions 32C from above without interfering with the upper housing 30 (see FIG. 2). In other words, the locking arm portions 83 of the second board connector 3 are not employed.

When the second board connector 3 is matingly connected to the intermediate connector 1, the signal terminals and ground terminals of the second board connector 3 come into contact with the ground layers 46, signal connection portions 45A, and signal connection portions 43A in the top portion of each intermediate board 40 under contact pressure, thereby entering an electrically conductive state. In this manner, due to the fact that the first board connector 2 and second board connector 3 are matingly connected to the intermediate connector 1, the first board connector 2 and second board connector 3 are electrically connected via the intermediate connector 1.

Once the connectors have been matingly connected, the intermediate connector 1 is locked to the first board connector 2, but is not locked to the second board connector 3. Therefore, when the second board connector 3 is gripped and pulled upwards during connector extraction, the second board connector 3 is extracted from the intermediate connector 1 with certainty, but the intermediate connector 1 is not extracted from the first board connector 2.

If it is desired to extract the intermediate connector 1 from the first board connector 2, first, the intermediate connector 1 is moved to one side in the connector width direction (side Y2 in FIG. 9 (C)), thereby positioning the lockable portions 22C-1 outwardly from the locking portions 83B in the connector width direction. Next, as shown in FIG. 9 (C), said one side is tilted and lifted by rotating the intermediate connector 1 such that the other side in the connector width direction (side Y1 in FIG. 9 (C)) is used as a fulcrum. Due to the fact that there are downwardly and outwardly protruding curved sections formed in the bottom portion of the locking portions 83B, when the lockable portions 22C-1 abut the above-mentioned sections in the process of lifting said one side, a pressure force directed inwardly in the connector width direction (in the direction towards side Y1 in FIG. 9 (C)) acts on the locking portions 83B and the rectilinear portions 83A undergo resilient deformation inwardly in the connector width direction. Therefore, this allows for said one side to be lifted further and, as a result, the lockable portions 22C-1 can be extracted upwardly from the locking portions 83B.

Next, by moving the intermediate connector 1 to the other side in the connector width direction and lifting said other side, the lockable portions 22C-1 are extracted upwardly from the locking portions 83B and, as a result, the intermediate connector 1 can be extracted from the first board connector 2.

As discussed previously, in the present embodiment, in which the locking arm portions 83 are formed in the coupling fittings 80 of the first board connector 2, the locking portions 83B of the locking arm portions 83 can be engaged and locked to the lockable portions 22C-1 of the lower housing 20 of the intermediate connector 1. If the setting of the vertical distance between the two circuit boards is changed, the first board connector 2 and second board connector 3 are used as-is without changes, and there is provided an additional intermediate connector 1 with vertical dimensions corresponding to the above-mentioned changed distance. In the intermediate connector 1 of the present embodiment, the lockable portions 22C-1 are formed in the lower housing 20, and not in the linking fittings 50. Consequently, since the linking fittings 50 do not have any locking functionality to begin with, there is no need to change their shape in response to changes made to the setting of the above-mentioned distance, and the fittings can be used as-is without changes. In other words, at least with respect to the linking fittings 50 in the intermediate connector 1, it is no longer necessary to manufacture additional components of a different shape. For this reason, the manufacture of the intermediate connector 1 is accordingly unlikely to be rendered cumbersome and, in addition, the increase in the cost of manufacture can be minimized.

The substrate 41 of the intermediate board 40 of the present embodiment is made by stamping a plate-shaped piece of substrate material in the through-thickness direction. Such substrate material is constructed by embedding a fiber cloth formed by braiding a plurality of fibers used for substrate reinforcement in a mesh pattern within a plate-like member made of plastic. Sections of locally high and low dielectric permittivity are formed at this time in the intermediate board 40 because of the different dielectric permittivities of the fiber cloth and plastics. In the present embodiment, the fiber cloth is formed as a glass cloth in which a plurality of glass fibers extending in the lengthwise direction are braided with a plurality of glass fibers extending in the widthwise direction in a grid mesh pattern.

Figure 10:
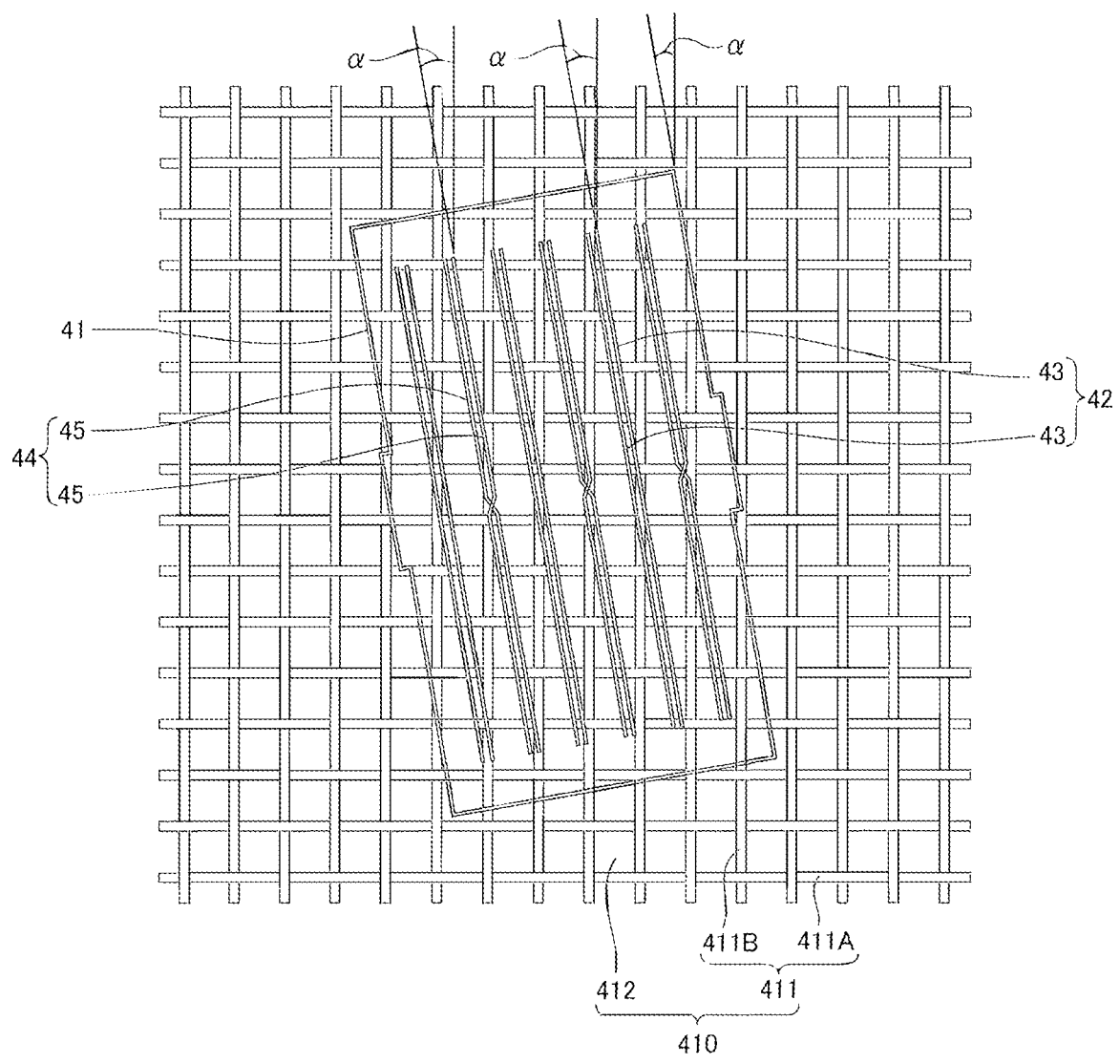
FIG. 10 illustrates a diagram illustrating the relationship between the position of the glass cloth of the substrate material and the substrate as well as the signal transmission line pairs.

FIG. 10 is a diagram illustrating the relationship between the position of the glass cloth 411 of the substrate material 410 and the substrate 41 as well as the signal transmission line pairs 42, 44. The substrate material 410 shown in FIG. 10 is formed by embedding the glass cloth 411 into a quadrangular plate-like member 412 made of plastic. Although the glass cloth 411 is in fact invisible from the outside because it is embedded within the plate-like member 412, in FIG. 10 it is shown in solid lines for ease of discussion.

The glass cloth 411 has a plurality of warp fibers 411A, i.e., glass fibers extending in the lengthwise direction, and a plurality of weft fibers 411B, i.e., glass fibers extending in the widthwise direction. Here, the warp fibers 411A extend in parallel to the longitudinal sides (not shown) of the plate-like member 412 and the weft fibers 411B extend in parallel to the transverse sides (not shown) of the plate-like member 412. The substrate 41 is made by stamping the substrate material 410 in the through-thickness direction in a position, such as the one shown in FIG. 10, in which the longitudinal direction of the substrate 41, when viewed in the through-thickness direction of the substrate material 410 (in the direction perpendicular to the plane of the drawing in FIG. 10), is inclined at a predetermined angle $\alpha$ relative to the weft fibers 411B of the glass cloth 411.

Although only one substrate 41 is shown in FIG. 10, a plurality of substrates 41, positioned side by side both in the longitudinal direction and in the transverse direction of said substrates 41, are obtained by stamping from a single piece of substrate material 410. At this time, it is preferable for the plurality of substrates 41 to be positioned side by side within the substrate material 410 in close proximity with minimal gaps in the longitudinal and transverse directions. Since positioning them in this manner allows for more substrates 41 to be made from a single piece of substrate material 410, it becomes possible to reduce waste of substrate material 410 and minimize increased costs of manufacture.

The signal transmission line pairs 42, 44, i.e., the straight pairs 42 and cross pairs 44 formed on the substrate material 410, are formed extending in the longitudinal direction of the substrate 41. Therefore, as shown in FIG. 10, the straight pairs 42 and cross pairs 44 are formed extending at a predetermined angle $\alpha$ to the weft fibers 411B of the glass cloth 411.

Therefore, each straight pattern 43 of the straight pairs 42, throughout its entire length, extends over a range in which sections of the glass cloth 411 in the substrate 41, that is, sections of glass, and sections of the plate-like member 412, that is, sections of plastic, are distributed in a regular manner. As a result, in the substrate 41, the patterns of dielectric permittivity distribution in the section corresponding to the entire longitudinal extent of the straight pairs 42 become substantially identical in one straight pattern 43 and the other straight pattern 43, and a major skew between the two paired straight patterns 43 becomes less likely to occur.

On the other hand, as far as the cross pairs 44 are concerned, a major skew between the two cross patterns 45 is unlikely to occur in the first place, due to the mid-way swapping of their relative positions. In the present embodiment, they are formed extending inclined at an angle relative to the warp fibers 411A of the glass cloth 411. Therefore, similar to what was stated above for the straight pairs 42, each cross pattern 45 of the cross pairs 44, throughout its entire length, extends over a range in which sections of the glass cloth 411 and sections of the plate-like member 412 in the substrate 41 are distributed in a regular manner. As a result, the above-described patterns of dielectric permittivity distribution in one cross pattern 45 and the other cross pattern 45 become even closer and a major skew becomes less likely to occur.

Thus, in the present embodiment, differences in skew between the straight pairs 42 and the cross pairs 44 are adequately reduced because a major skew is unlikely to occur both in the straight pairs 42 and in the cross pairs 44.

Figure 11:
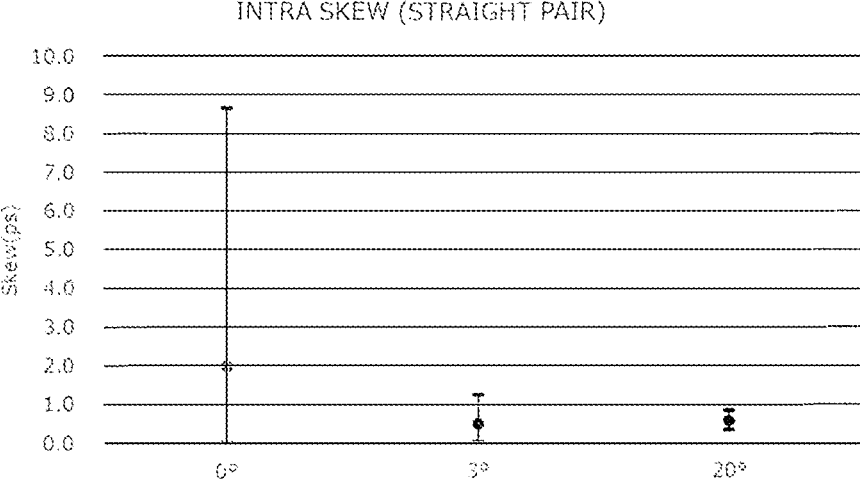
FIGS. 11 (A) and 11 (B) are graphs illustrating the skew generated when signals were injected into the signal transmission line pairs of an intermediate board, wherein FIG. 11 (A) is a graph related to the straight pairs, and FIG. 11 (B) is a graph related to the cross pairs.
Figure 11:
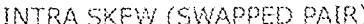
Figure 11:
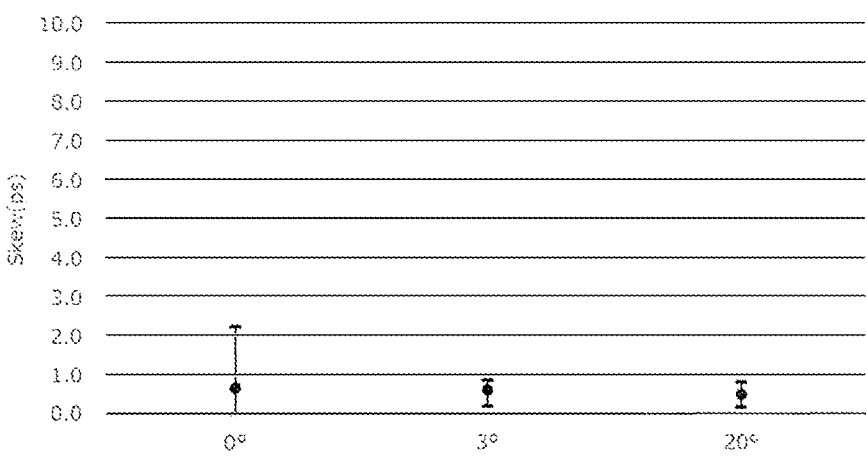

FIG. 11 (A) and FIG. 11 (B) are graphs illustrating the results of an experiment conducted to measure the skew generated when injecting high-speed differential signals into the signal transmission line pairs 42, 44 of an intermediate board 40, wherein FIG. 11 (A) is a graph related to the straight pairs 42, and FIG. 12 (B) is a graph related to the cross pairs 44. In this experiment, the skew was measured for each straight pair 42 and cross pair 44 by gradually increasing the angle of inclination of the straight pairs 42 and cross pairs 44, i.e., the angle $\alpha$ shown in FIG. 10, starting from 0°. The graphs of FIG. 11 (A) and FIG. 11 (B) illustrate the results obtained when the angle of inclination was respectively 0°, 3°, and 20°. Here, a 0° angle of inclination means that the signal transmission line pairs 42, 44 extended in parallel to the warp fibers 411A.

Albeit not shown in FIG. 11 (A) and FIG. 11 (B), as the angle of inclination was increased from 0° in the above-mentioned experiment, the skew was first rapidly reduced and, starting from about 2°, was reduced more slowly. At 3° or more, the skew remained practically unchanged. In other words, it can be said that the skew stabilized at a small value at about 3°.

As shown in FIG. 11 (A) and FIG. 11 (B), when the angle of inclination was 3°, as well as when the angle of inclination was 20°, the skew was reduced and improved in comparison with a 0° angle of inclination both in the straight pairs 42 and in the cross pairs 44. In the straight pairs 42, in particular, the degree of skew reduction was larger than in the cross pairs 44. In addition, when the angle of inclination was 3°, as well as when the angle of inclination was 20°, the difference in skew between the straight pairs 42 and cross pairs 44 was smaller than when the degree of inclination was 0°. Thus, it is also evident from the experimental results that differences in skew between the straight pairs 42 and the cross pairs 44 were adequately reduced.

In addition, as discussed previously, in order to increase the yield of substrates 41 from a single piece of substrate material 410 as much as possible, a plurality of substrates 41 are positioned side by side within the substrate material 410 in close proximity with minimal gaps in the longitudinal and transverse directions. It has been found that if, at this time, the above-mentioned angle of inclination is set to around 2° to 20°, the yield of the substrates 41 can be made sufficiently large while making the differences in skew sufficiently small.

Although in the present embodiment the fiber cloth is formed of glass fiber, the material of the fiber cloth is not limited thereto, and, for example, may consist of fiber-reinforced plastics and other materials used to reinforce intermediate boards.

Although the present embodiment describes an example, in which the signal transmission line pairs 42, 44 (straight pairs 42 and cross pairs 44) are inclined relative to the glass cloth 411 serving as the fiber cloth throughout their entire longitudinal extent, it is not essential for the incline relative to the fiber cloth to span the entire longitudinal extent and it may be a partial range in the longitudinal direction of the signal transmission line pairs.

Although in the present embodiment each of the two counterpart connect bodies connected to the intermediate connector 1 is a connector (board connectors 2, 3), alternatively, as a variation, one counterpart connect body may be a connector, and the other counterpart connect body may be a cable. In other words, in such a variation, the intermediate connector will have a connector matingly connected to one side thereof, and a cable attached to the other.

Although in the present embodiment the board connectors 2, 3 serving as counterpart connect bodies are connected to the intermediate connector 1 respectively from below and from above, the direction of connection of the counterpart connect bodies is not limited thereto, and, as a variation, the direction of connection of one counterpart connect body and the direction of connection of the other counterpart connect body to the intermediate connector may be adapted to intersect. In such a variation, for example, one counterpart connect body may be connected to the intermediate connector from below, and the other counterpart connect body may be connected to the intermediate connector such that the direction of connection is a direction perpendicular to the vertical direction. In other words, in such a case, the intermediate connector will be constructed as a so-called right-angle connector.

DESCRIPTION OF THE REFERENCE NUMERALS

1 Intermediate connector
2 First board connector (counterpart connect body)
3 Second board connector (counterpart connect body)
40 Intermediate boards (intermediate circuit boards)
41 Substrate
42 Straight pairs (signal transmission line pairs)
43 Straight patterns (signal transmission lines)
44 Cross pairs (signal transmission line pairs)
45 Cross patterns (signal transmission lines)
411 Glass cloth (fiber cloth)
411A Warp fibers (fibers)

411B Weft fibers (fibers)
412 Plate-like member
The invention claimed is:

1. An intermediate circuit board provided in an intermediate electrical connector establishing intermediate connections between two counterpart connect bodies, the board having a plate-shaped substrate, and, on a major face of the substrate, a plurality of signal transmission line pairs for differential signal transmission extending from one end of the substrate, to which one counterpart connect body is connected, continuously to an other end of the substrate to which the other counterpart connect body is connected, wherein:

the substrate has a fiber cloth formed by braiding a plurality of fibers used to reinforce the substrate in a mesh pattern, and a plate-like member made of plastic having the fiber cloth embedded therein;

the plurality of signal transmission line pairs have straight pairs and cross pairs disposed in an alternating manner;

the straight pairs are formed of two signal transmission lines extending in parallel to each other, or two signal transmission lines having intersection portions in which intersection takes place without contact at an even number of locations in a longitudinal direction of the straight pairs;

the cross pairs are formed of two signal transmission lines having intersection portions in which intersection takes place without contact at an odd number of locations in a longitudinal direction of the cross pairs;

signal connection portions of the straight pairs and signal connection portions of the cross pairs extend parallel to a longitudinal direction of the intermediate circuit board, and ends of the signal connection portions are arranged so that they are parallel to top or bottom edges of the intermediate circuit board; and the straight pairs and cross pairs, when viewed in a through-thickness direction of the substrate, have at least one longitudinal portion of said straight pairs and cross pairs formed extending inclined at an angle relative to the fibers of the fiber cloth.

2. The intermediate circuit board according to claim 1, wherein the straight pairs and cross pairs, when viewed in the through-thickness direction of the substrate, have at least one longitudinal portion of said straight pairs and cross pairs inclined at an angle of 2 to 20 degrees relative to the fibers of the fiber cloth.

3. The intermediate circuit board according to claim 2, wherein the intermediate circuit board is part of an intermediate electrical connector.

4. The intermediate circuit board according to claim 2, wherein the angle of 2 to 20 degrees is selected to provide both reduced skew and increased yield of substrates from substrate material.

5. The intermediate circuit board according to claim 1, wherein the intermediate circuit board is part of an intermediate electrical connector.

6. The intermediate circuit board according to claim 1, wherein the signal transmission lines of the straight pairs and the signal transmission lines of the cross pairs each comprise signal connection portions, a plurality of thin ridge portions separately extending in a longitudinal direction, and a plurality of signaling vias extending through a thickness of the substrate in the through-thickness direction, and wherein the signal connection portions and the plurality of thin ridge portions are coupled to one another by the signaling vias such that the signal transmission lines are formed in two layers within the thickness of the substrate.

7. The intermediate circuit board according to claim 1, wherein the substrate is made by stamping a plate-shaped piece of substrate material in the through-thickness direction.

8. The intermediate circuit board according to claim 1, wherein the fiber cloth comprises a plurality of warp fibers extending in a lengthwise direction and a plurality of weft fibers extending in a widthwise direction, and wherein the longitudinal direction of the substrate, when viewed in the through-thickness direction of the substrate, is inclined at the angle relative to the weft fibers of the fiber cloth.

9. The intermediate circuit board according to claim 1, wherein the plurality of signal transmission line pairs comprise three straight pairs and three cross pairs disposed in an alternating manner.

* * * * *